United States Patent [19]

Rostoker et al.

[11] Patent Number: 5,311,060
[45] Date of Patent: May 10, 1994

[54] HEAT SINK FOR SEMICONDUCTOR DEVICE ASSEMBLY

[75] Inventors: Michael D. Rostoker; Mark Schneider, both of San Jose; Edwin Fulcher, Palo Alto, all of Calif.

[73] Assignee: LSI Logic Corporation, Milpitas, Calif.

[21] Appl. No.: 922,713

[22] Filed: Jul. 28, 1992

Related U.S. Application Data

[63] Continuation-in-part of Ser. No. 865,817, Apr. 1, 1992, Pat. No. 5,175,612, which is a continuation of Ser. No. 671,677, Mar. 19, 1991, abandoned, which is a continuation of Ser. No. 454,752, Dec. 19, 1989, abandoned.

[51] Int. Cl.⁵ ............... H01L 39/02; H01L 23/48; H01L 29/44; H02B 1/00
[52] U.S. Cl. ................. 257/796; 257/667; 257/675; 257/676; 257/713; 361/714
[58] Field of Search ............. 257/667, 668, 675, 676, 257/712, 713, 718, 719, 787, 796; 361/389, 383, 386

[56] References Cited

U.S. PATENT DOCUMENTS

| | | | |
|---|---|---|---|
| 3,429,040 | 2/1969 | Miller | 29/626 |
| 3,701,451 | 10/1972 | Schindler et al. | 220/27 |
| 3,811,186 | 5/1974 | Larnerd et al. | 29/626 |
| 3,871,014 | 3/1975 | King et al. | 357/67 |
| 4,100,566 | 7/1978 | Okikawa et al. | 357/70 |
| 4,141,030 | 2/1979 | Eisele et al. | 357/79 |
| 4,190,855 | 2/1980 | Inoue | 357/80 |
| 4,340,902 | 7/1982 | Honda et al. | 357/74 |
| 4,355,463 | 10/1982 | Burns | 29/827 |

(List continued on next page.)

FOREIGN PATENT DOCUMENTS

| | | | |
|---|---|---|---|
| 57-210638 | 12/1982 | Japan | H01L 21/60 |
| 59-117244 | 7/1984 | Japan | H01L 23/28 |
| 60-49638 | 3/1985 | Japan | H01L 21/60 |
| 61-142750 | 6/1986 | Japan | H01L 21/60 |
| 61-145838 | 7/1986 | Japan | H01L 21/60 |
| 63-239827 | 10/1988 | Japan | H01L 21/60 |
| 63-268418 | 11/1988 | Japan | H02G 3/16 |
| 2-128453 | 5/1990 | Japan | |
| WO92/11654 | 7/1992 | World Int. Prop. O. | 23/02 |

OTHER PUBLICATIONS

*LED Array Modules by New Technology Microbump Bonding Method*, by Hatada, Fujimoto, Ochi & Ishida, Sep. 1990, IEEE V. 13, No. 3.
*Overmolded Plastic Pad Array Carriers*, by Freyman & Pennisi, 1991, IEEE.
*Packaging Ideas*, by Markstein, May 1992, Electronic Packaging & Production.

*Primary Examiner*—Andrew J. James
*Assistant Examiner*—Carl Whitehead, Jr.
*Attorney, Agent, or Firm*—Gerald E. Linden

[57] ABSTRACT

A first, lower heat sink disposed immediately below and closely adjacent a semiconductor chip (die) in a semiconductor chip assembly is disclosed. The lower heat sink is a flat metallic or ceramic shim. A second, upper heat sink disposed immediately above and closely adjacent the top surface of the semiconductor device is disclosed. The upper heat sink may have a portion in contact with a passivation layer over the top surface of the semiconductor die (device). The second heat sink preferably has a flat surface forming an exterior surface of the semiconductor device assembly. In one embodiment, the second heat sink has pedestals resting atop a plastic layer in a tape-like structure within the semiconductor chip assembly. In a second embodiment, the second heat sink includes an add-on portion that is external to the semiconductor chip assembly. The first heat sink is particularly well-suited to applications wherein the semiconductor chip assembly is mounted to a thermal mass. The second heat sink is particularly well-suited to applications wherein air cooling is available. Each of the first and second heat sinks provide effective cooling, and when used together provide even more effective cooling. Alternatively, the die may be mounted to the top surface of a printed circuit board support structure, the bottom surface of which is provided with a plurality of solder bumps.

26 Claims, 4 Drawing Sheets

U.S. PATENT DOCUMENTS

| | | | |
|---|---|---|---|
| 4,396,935 | 8/1983 | Schuck | 357/74 |
| 4,460,537 | 7/1984 | Heinle | 264/272.17 |
| 4,545,610 | 10/1985 | Lakritz et al. | 29/589 |
| 4,587,550 | 5/1986 | Matsuda | 357/79 |
| 4,620,215 | 10/1986 | Lee | 357/81 |
| 4,631,805 | 12/1986 | Olsen et al. | 29/588 |
| 4,680,617 | 7/1987 | Ross | 357/72 |
| 4,688,152 | 8/1987 | Chia | 361/408 |
| 4,700,276 | 10/1987 | Freyman et al. | 361/403 |
| 4,700,473 | 10/1987 | Freyman et al. | 29/846 |
| 4,717,066 | 1/1988 | Goldenberg et al. | 228/179 |
| 4,771,330 | 9/1988 | Long | 357/80 |
| 4,803,546 | 2/1989 | Sugimoto et al. | 357/74 |
| 4,825,284 | 4/1989 | Soga et al. | 357/80 |
| 4,868,349 | 9/1989 | Chia | 174/52.4 |
| 4,874,722 | 10/1989 | Bednarz et al. | 437/209 |
| 4,890,194 | 12/1989 | Deeryberry et al. | 361/386 |
| 4,926,241 | 5/1990 | Carey | 357/75 |
| 4,935,581 | 6/1990 | Komathu | 174/52.4 |
| 4,961,105 | 10/1990 | Yamamoto | 357/72 |
| 4,970,575 | 11/1990 | Soga et al. | 357/72 |
| 4,970,577 | 11/1990 | Ogihara et al. | 357/74 |
| 5,006,673 | 4/1991 | Freyman et al. | 174/255 |
| 5,012,386 | 4/1991 | McShane et al. | 361/386 |
| 5,047,837 | 9/1991 | Kitano et al. | 357/81 |
| 5,077,633 | 12/1991 | Freyman et al. | 361/403 |
| 5,153,379 | 10/1992 | Guzuk et al. | 174/35 R |
| 5,153,385 | 10/1992 | Juskey et al. | 174/260 |
| 5,172,303 | 12/1992 | Bernardoni et al. | 361/396 |
| 5,195,023 | 3/1993 | Manzione et al. | 361/392 |
| 5,216,278 | 6/1993 | Lin et al. | 257/688 |

HEAT SINK FOR SEMICONDUCTOR DEVICE ASSEMBLY

CROSS-REFERENCE TO RELATED U.S. PATENT APPLICATIONS

This is a continuation-in-part of commonly-owned U.S. patent application No. 07/865,817, filed Apr. 1, 1992 (now U.S. Pat. No. 5,175,612, issued Dec. 29, 1992), which is a continuation of commonly-owned U.S. patent application Ser. No. 07/671,677, filed Mar. 19, 1991 (now abandoned), which is a continuation of U.S. patent application No. 07/454,752, filed Dec. 19, 1989 (now abandoned).

TECHNICAL FIELD OF THE INVENTION

The invention relates to heat dissipation in semiconductor devices, and more particularly to heat sinks provided for heat dissipation.

BACKGROUND OF THE INVENTION

Heat is inevitably generated during operation of a semiconductor device, and may become destructive of the device if left unabated. Therefore, it is generaly well known to provide some sort of heat sink for such devices. Generally, heat sinks take one of two forms. They may be integral with the device package or they may be external to the device package. In either case, heat sinks generally include a thermal mass in intimate heat conductive relationship to the semiconductor device, and may involve air convection or forced air cooling of the thermal mass.

As used herein, the term "semiconductor device" refers to a silicon chip or die containing circuitry, and the term "semiconductor device assembly" refers to the semiconductor chip and associated packaging containing the chip, including leads such as for connecting to a socket or a circuit board, and internal connections, such as bond wires, of the chip to the leads.

Commonly-owned U.S. Pat. No. 4,800,419, entitled SUPPORT ASSEMBLY FOR INTEGRATED CIRCUITS and filed on Jan. 28, 1987, discloses a composite support assembly for an integrated circuit chip. The support assembly includes a rigid lead frame that is attached to a relatively thin, flexible, tape-like structure. The tape-like structure includes a metallic layer that is etched with inner and outer lead "fingers" allowing for a short pitch, high density arrangement of the lead fingers, thereby enabling bond wires that connect a semiconductor chip to the support assembly to be relatively short. The metallic layer is supported by a segmented plastic film layer, preferably formed of KAPTON trademark of DuPont Corp.).

Commonly-owned U.S. Pat. No. 4,771,330, entitled WIRE BONDS AND ELECTRICAL CONTACTS OF AN INTEGRATED CIRCUIT DEVICE aned filed on May 13, 1987, discloses an integrated circuit device package including a rigid frame and flexible tape assembly having wire leads between the die attach pad, conductive lead fingers and the integrated circuit (IC) chip. A dam structure prevents resin flow to ensure proper wire bonding.

Commonly-owned, U.S. Pat. No. 5,087,961, entitled METHOD AND MEANS OF FABRICATING A SEMICONDUCTOR DEVICE PACKAGE and filed on Oct. 30, 1987, discloses a semiconductor device assembly having a patterned conductive layer, including a die attach pad and a plurality of leads, and a patterned insulating layer. A semiconductor die is seated on the die attach pad and is connected, such as by bond wires, to the leads. A silicone gel, such as Dow Corning Q1-4939, having a 1 to 10 mixing ratio of curing agent to base, is applied over the bond wires. A body frame, preferably made of a polymer material such as RYTON (trademark of Phillips Chemical Co.) is positioned around the die, and an encapsulant material, such as HYSOL CNB 405-12 (trademark of Hysol) is distributed within the RYTON frame over the semiconductor die and die connections.

Commonly-owned, U.S. Pat. No. 5,023,202 entitled STRIP CARRIER FOR INTEGRATED CIRCUITS and filed on Jul. 14, 1989, discloses a semiconductor device assembly having a patterned conductive layer and a patterned insulating layer, and mounted to a strip carrier providing mechanical rigidity to the semiconductor device assembly during assembly thereof. After assembly, the packaged semiconductor device assembly is excised from the strip carrier.

The aforementioned patents and applications relate to semiconductor device assemblies having a high lead count and that may operate at high speeds, both of which factors contribute to increased heat generated by the semiconductor device. Semiconductor device assemblies such as these may be improved by the present invention, and are incorporated by reference herein.

DISCLOSURE OF THE INVENTION

It is therefore an object of the present invention to provide a technique for improved heat dissipation in a semiconductor device assembly.

It is a further object of the invention to provide a self-contained heat sink structure within a semiconductor device assembly.

It is a further object of the invention to provide a heat sink structure in a semiconductor device assembly that is wire bonded or TAB (tape automated bonding) bonded to a tape carrier.

It is a further object of the invention to provide a heat sink structure in a semiconductor device assembly that is readily customized by an end user for particular applications.

It is a still further object of the invention to provide a modified mechanical structure to a semiconductor device assembly whereby a flat registration surface is obtained, such as would be useful in automated handling of the semiconductor device assembly.

According to the invention, a first heat sink, in the form of a metallic or ceramic shim, is disposed immediately below and closely adjacent a semiconductor die in a semiconductor device assembly.

According to an aspect of the invention, the die is supported on a thermally conductive die attach pad, which is part of a patterned metallic layer including leads. A plastic film layer, which normally extends beneath and covers the die attach pad, is provided with a cutout for attaching the first heat sink to the die attach pad, such as with an epoxy thermally-conductive adhesive.

Further according to the invention, a second heat sink, in the form of a shaped metallic or ceramic block, is disposed immediately above the die, and a lower portion of the second heat sink is closely adjacent the upper surface of the semiconductor die.

According to an aspect of the invention, the upper surface of the second heat sink is flat and extends out of the encapsulated semiconductor device assembly.

According to a feature of the invention, the first and second heat sinks may be used alone or in combination with each other.

According to an alternate embodiment of the invention, the second heat sink is further provided with an add-on section that is joined to the upper surface of the second heat sink and resides entirely exterior the semiconductor device assembly.

According to an aspect of the invention, the add-on section is tailored in conformity with the ultimate end use of the semiconductor device assembly.

The heat sink of the present invention is exspecially useful in connection with the semiconductor device assemblies of the aforementioned commonly-owned U.S. patents.

Other objects, features and advantages of the invention will become apparent in light of the following description thereof.

DETAILED DESCRIPTION OF THE INVENTION

Figure 1A:
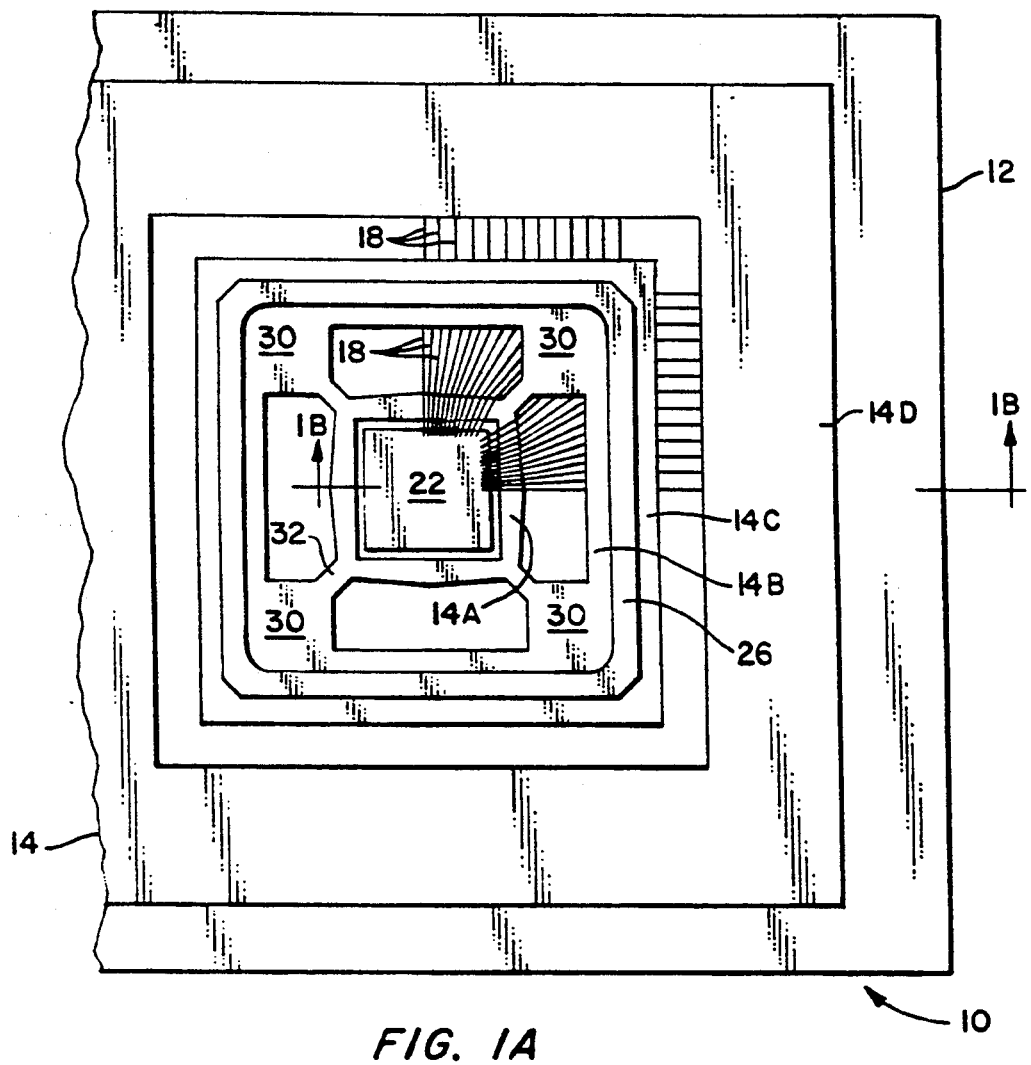
FIG. 1A is a top plan view of a semiconductor device assembly, such as is disclosed in the aforementioned commonly-owned, U.S. Pat. No. 5,023,202.
Figure 1B:
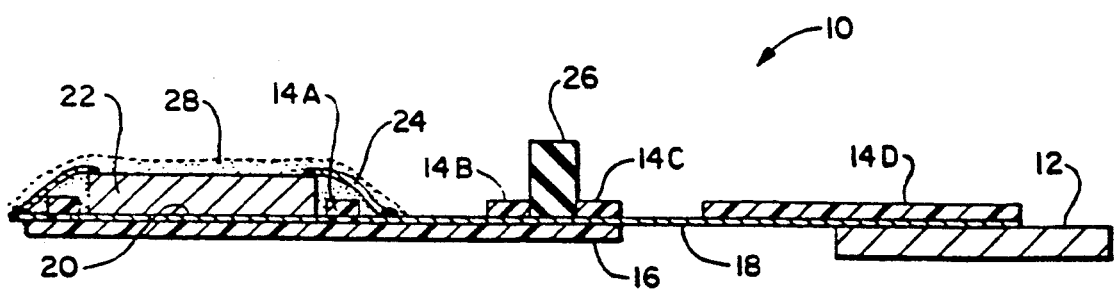
FIG. 1B is a partial cross-sectional view of the semiconductor device assembly of FIG. 1A, taken on the line 1B—1B.
Figure 1C:
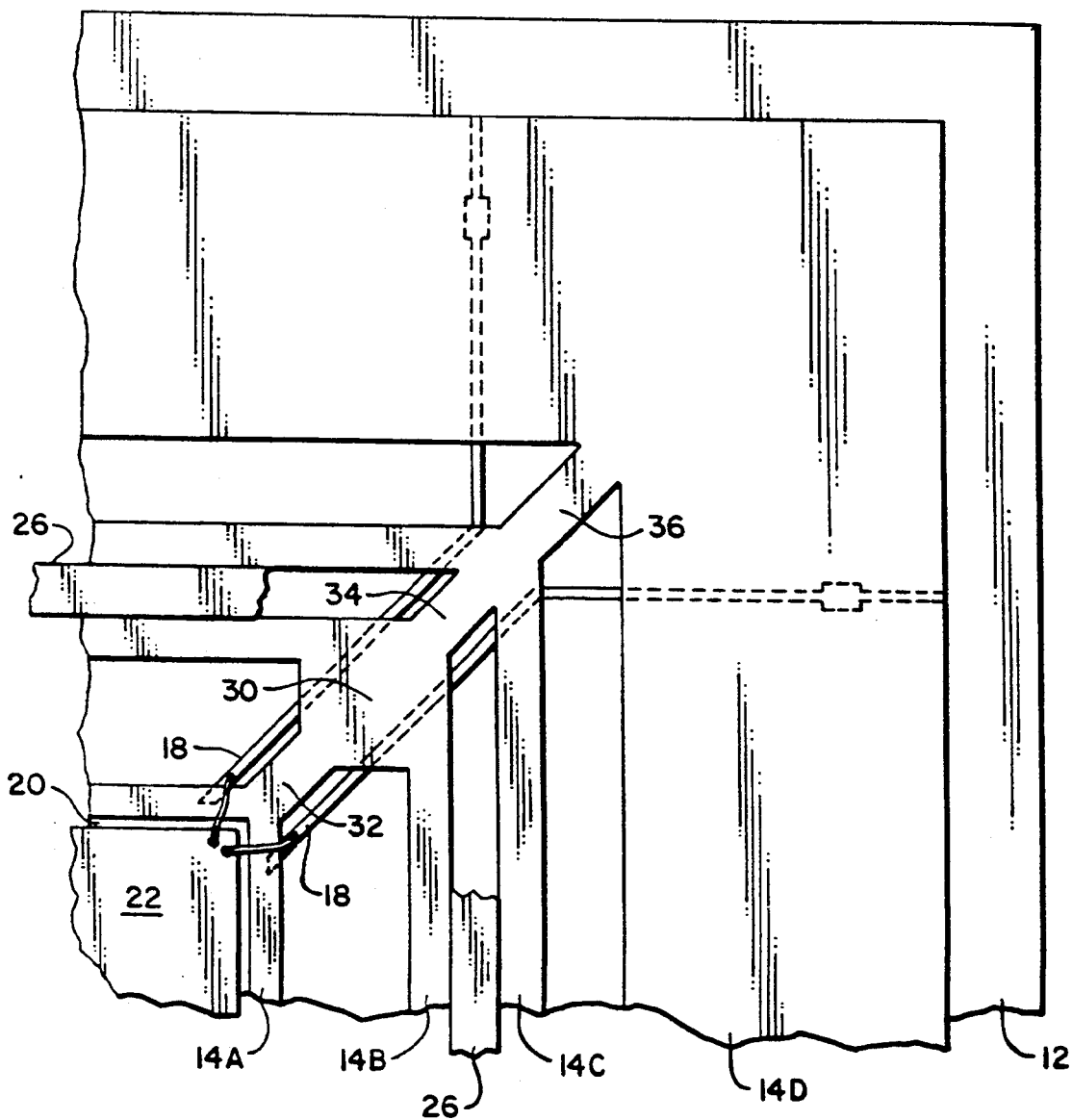
FIG. 1C is a more detailed, partial top plan view of the semiconductor device assembly of FIG. 1A.

FIGS. 1A, 1B and 1C show a semiconductor device assembly 10. Generally, as disclosed in the aforementioned, commonly-owned, U.S. Pat. No. 5,023,202, the semiconductor device assembly 10 includes an upper, segmented plastic film layer 14 (formed of segments 14A, 14B, 14C and 14D), a lower plastic film layer 16, metallic leads 18 sandwiched between the two plastic layers 14 and 16, a metallic (preferably copper) die attach pad 20 supported between the two plastic layers 14 and 16, a semiconductor device 22 mounted on the die attach pad 20 and bond leads 24 connecting the semiconductor device 22 to the leads 18. As disclosed in the aforementioned U.S. Pat. No. 5,087,961, in lieu of employing bond wires 24, conductive bumps may be employed to provide a conductive path from the device 22 to the leads 18 in a tape automated bonding (TAB) process.

More particularly, the semiconductor device assembly 10 is formed as follows. The upper plastic layer 14 does not form a continuous surface, but rather is segmented to include an inner ring portion 14A, an intermediate ring portion 14B disposed outside of the inner ring portion, an outer ring portion 14C disposed outside of the intermediate ring portion and and an exterior ring portion 14D disposed outside of the outer ring portion. The upper plastic layer 14 is preferably formed of KAPTON, and forms a thin, insulating supportive structure for the leads 18. In a region between the inner and intermediate ring portions 14A and 14B, respectively, "inner" portions of the leads 18 are very closely spaced. In a region between the intermediate and exterior ring portions 14B and 14D, respectively, "outer" portions of the leads 18 are more spread out. The inside periphery of the inner ring portion 14A supports the outside periphery of the die attach pad 20, and the outside periphery of the inner ring portion 14A supports the innermost ends of the leads 18, in essence forming a "bridge" between the die attach pad and the leads. A rubber-like or plastic-like ring ("body frame") 26 is disposed atop the leads 18 between the intermediate ring portion 14B and the outer ring portion 14C. The ring 26 is preferably formed of RYTON, and is joined to the leads 18 by an adhesive, such as a B-stage adhesive such as RT-4B (trademark of RJR Polymers). As shown, a layer-like quantity of silicone gel 28, such as Dow Corning Q1-4939, having a 1 to 10 mixing ratio of curing agent to base, encapsulates the leads 24. The quantity of silicone gel acts as a moisture barrier and a stress relief for the leads 24 during assembly of the semiconductor device assembly, and further prevents an ultimate encapsulation epoxy (not shown in FIGS. 1A, 1B and 1C, shown as elements 60 and 94 in FIGS. 2 and 3, respectively) from contacting the semiconductor die. Surface tension between the silicone gel and the leads 24 keeps the silicone gel in place around the leads during assembly of the semiconductor device assembly. The lower plastic layer 16 covers the bottom of the die attach pad 20, and extends generally over the entire area described by the outer ring portion 14C, on the opposite side of the leads 18 and die attach pad 20. The lower plastic layer 16 is preferably formed of KAPTON.

As disclosed in the aforementioned U.S. Pat. No. 5,023,202, a surrogate lead frame (edge ring) 12 is provided for handling the semiconductor device assembly during manufacture thereof, and shorts the outer ends of the leads 18 to facilitate electroplating. Further, the semiconductor device assembly is encapsulated with epoxy extending over the semiconductor device 22, bond leads 24 (including the silicone gel layer 28) and inner and intermediate ring portions 14A and 14B, respectively, up to the RYTON ring 26. Further, after completion of the manufacturing process the semiconductor device assembly is excised from the lead frame 12 and exterior ring portion 14D, neither of which properly form any part of the ultimate semiconductor device assembly 10. The RYTON ring 26 also prevents the intermediate KAPTON ring portion 14B from "wicking" moisture into the semiconductor device assembly.

With particular reference to FIG. 1C, it is evident that the four corner sections of the intermediate ring portion 14B each extend inwardly toward the inner ring portion 14A, forming a square KAPTON "pad" 30. Further, at each of the four corners of the inner ring portion, a first KAPTON "bridge" 32 is formed connecting the inner ring portion 14A to the intermediate ring portion 14B at a pad 30. Further, at each of the four corners of the intermediate ring portion 14B, a second KAPTON bridge 34 is formed connecting the intermediate ring portion 14B to the outer ring portion 14C.

Further, at each of the four corners of the outer ring portion 14C, a third KAPTON bridge 36 is formed connecting the outer ring portion 14C to the exterior ring portion 14D. Ultimately, the second and third KAPTON bridges 34 and 36 may be excised from the semiconductor device assembly, as is illustrated in FIG. 1A.

Semiconductor Device Assembly

Figure 2:
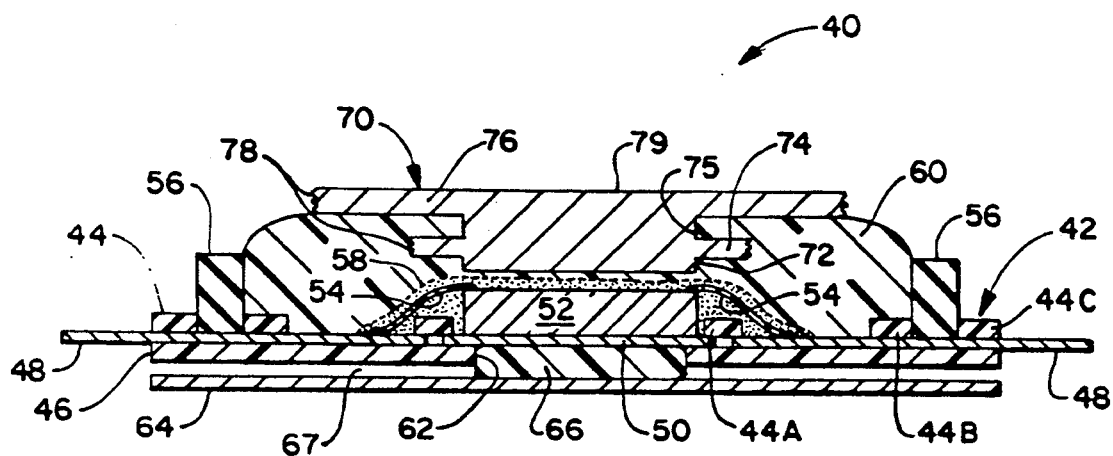
FIG. 2 is a cross-sectional view of the heat sink for semiconductor devidce assembly of the present invention.

FIG. 2 shows an embodiment 40 of the heat sink for semiconductor chip assembly of the present invention. As discussed with respect to FIGS. 1A, 1B and 1C, the semiconductor device assembly 40 includes an upper, segmented plastic film layer 44 (including portions 44A, 44B, 44C and 44D), a lower plastic film layer 46, metallic leads 48 sandwiched between the two plastic layers 44 and 46, a metallic die attach pad 50 supported between the two plastic layers 44 and 46, a semiconductor device 52 mounted atop the die attach pad 50 and bond leads 54 connecting the semiconductor device 52 to the leads 48.

As discussed with reference to FIGS. 1A, 1B and 1C, the upper plastic layer 44 does not form a continuous surface, but rather is segmented to include an inner ring portion 44A, an intermediate ring portion 44B disposed outside of the inner ring portion and an outer ring portion 44C disposed outside of the intermediate ring portion. (The exterior ring portion 14D and lead frame 12 are not shown in the views of FIGS. 2 or 3, the semiconductor device assembly being shown as excised therefrom.) The upper plastic layer 44 is preferably formed of KAPTON. The inside periphery of the inner ring portion 44A supports the outside periphery of the die attach pad 50, and the outside periphery of the inner ring portion 44A supports the innermost ends of the leads 48. A rubber-like or plastic-like ring 56, preferably formed of RYTON, is disposed atop the leads 48 between the intermediate ring portion 44B and the outer ring portion 44C. A layer-like quantity of silicone gel 58 encapsulates the leads 54, and the semiconductor device assembly is eventually encapsulated with "glop-top" epoxy 60.

Whereas in the semiconductor device assembly 10, discussed with respect to FIGS. 1A and 1B, the lower plastic layer 16 (FIGS. 1A, 1B and 1C) forms a continuous surface extending completely under the die attach pad 20 over an area roughly equivalent to that defined by the intermediate ring portion 14B of the upper layer 14, in the present invention the lower KAPTON layer 46 is provided with a cutout (opening) 62 directly under the die attach pad 50. The cutout 62 exposes the bottom surface of the die attach pad 50 for purposes discussed hereinafter. As is seen in FIG. 2, the cutout 62 is dimensioned slightly smaller than the die attach pad 50 in order that the inside periphery of the lower layer 46 slightly overlaps, and consequently supports, the outside periphery of the die attach pad 50 on its bottom surface. The die attach pad 50 is typically square in configuration, commensurate with the plan configuration of a typical semiconductor device. Hence, the cutout 62 is preferably square.

Lower Heat Sink

A slug-like dab (dollop) 66 of epoxy, preferably a silicone-based epoxy, is disposed on the bottom surface of the die attach pad 50, adheres thereto, and extends through the opening 62 in the lower KAPTON layer 46. In order to effect the desired heat sink effect of the present invention, the epoxy is preferably heat, and possibly electrically, conductive. It is preferable to keep its thickness to a minimum, and that it have good thermal qualities.

A flat, plate-like shim 64 is adhered to the epoxy 66 opposite the die attach pad 50 and parallel to the lower KAPTON layer 46. The overall dimension (area) of the shim 64 is roughly equivalent to that of the area encompassed by the RYTON frame 56, preferably extending as far as the lower KAPTON layer 46, and a small air gap 67 remains between the shim 64 and the lower KAPTON layer 46.

In order to effect the desired heat sink effect of the present invention, the shim 64 possesses good heat dissipation qualities, and may be made of aluminum or ceramic.

As is shown in FIG. 2, only a small, central portion of the shim 64 is actually attached (via the epoxy 66) to the die attach pad 50. Such a small contact area is important because of typically disparate thermal expansion characteristics of the shim 64 vis-a-vis the remainder of the semiconductor device assembly 40, which could otherwise result in breaking the leads 48. It is however important that the shim 64 is in intimate thermal communication with the semiconductor device 52. One advantage of the arrangement of the shim 64, directly under the semiconductor device 52, is that it is separated therefrom by only a thin layer of thermally conductive epoxy 66 and the thin, thermally conductive die attach pad 50.

Typical dimensions and materials for the shim 64 are 10–15 mil thick metal, such as aluminum, or 10–15 mil thick ceramic material, such as Beryllium Oxide or Aluminum Nitrate. Ceramic materials would seem to afford the better opportunity for keeping the shim thickness to a minimum. Preferably, insofar as thermal expansion characteristics of the shim 64 are concerned, the shim would closely match the thermal expansion characteristics of the plastic layer 46.

The shim 64, centered below the semiconductor device (die) and in thermal communication therewith, forms a first, lower heat sink. A second, upper heat sink is now discussed.

Upper Heat Sink

FIG. 2 shows a second, upper heat sink 70. The upper heat sink 70 is centered above the semiconductor die 52 and is in thermal communication therewith. The heat sink 70 is a metallic or ceramic structure forming a thermal mass and conducting heat away from the semiconductor device 52. As viewed from the die 52 outward (upward in FIG. 2), the heat sink 70 includes a first disc-like region 72 having a preferably flat surface in close proximity to the die 52, a second disc-like region 74 of increased diameter and a third, disc-like region 76 of further increased diameter terminating in an upper, flat surface 79. The upper, flat surface 79 of the heat sink 70 forms an exterior surface of the semiconductor chip assembly 40. The second disc-like region 74 and possibly the third disc-like region 76 are preferably provided with ridges 78 about their periphery. Ultimately, the semiconductor chip assembly 40 is encapsulated with a potting compound, such as epoxy 60, which extends from the RYTON ring 56 to the second disc-like region 74, as shown. The epoxy 60 secures the heat sink 70 within the semiconductor chip assembly 40. The ridges 78 in the second disc-like region 74 provide increased surface area and irregular topography for adhering to the epoxy 60.

As illustrated in FIG. 2, the first disc-like region 72 is extends coaxially from the bottom surface of the second disc-like region 74, and the third disc-like region 76 is disposed coaxially above the second disc-like region 74, separated therefrom by a coaxial region 75 of decreased diameter (i.e., smaller than the diameter of the second or third regions, 74 and 76, respectively).

It should be understood, that although the uper heat sink 70 has been discussed in terms of "disk-like" regions having "diameters", that the upper heat sink is preferably square in plan profile, corresponding to the square configuration of the die 52 and the square configuration of the semiconductor device assembly (See, e.g., FIG. 1A).

Alternate Embodiment—Upper Heat Sink

Figure 3:
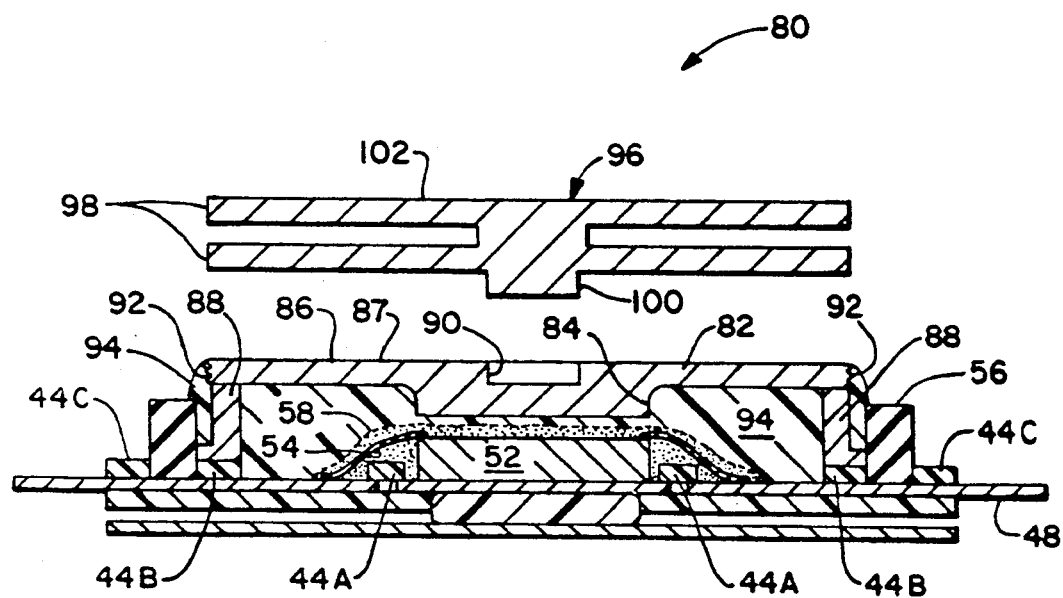
FIG. 3 is a cross-sectional view of an alternate embodiment of the heat sink for semiconductor device assembly of the present invention.

FIG. 3 shows an alternate embodiment 80 of the heat sink for semiconductor chip assembly of the present invention. Generally, the upper plastic layer 44A, 44B and 44C, the lower plastic layer 46, the leads 48, the die attach pad 50, the semiconductor device 52, the leads 54, the RYTON ring 56 and the silicon gel 58 are as discussed with respect to FIG. 2. The upper heat sink, however, includes both a fixed portion 82, embedded within the semiconductor chip assembly 80, and an "add-on" portion 86, which resides entirely exterior the semiconductor chip assembly. The heat sink is a metallic or ceramic structure forming a thermal mass and conducting heat away from the semiconductor device 52.

The fixed portion 82 of the heat sink includes a first, disk-like region 84 having a preferably flat surface in close proximity to the die 52 and a second disc-like region 86 of increased diameter terminating in an upper, flat surface 87. The upper, flat surface 87 of the fixed portion 82 of the heat sink forms an exterior surface of the semiconductor chip assembly 80. The second disc-like region 86 is preferably provided with ridges 92 about its periphery. Ultimately, the semiconductor device assembly 80 is encapsulated with a potting compound, such as epoxy 94, which extends from the RYTON ring 56 to the second disc-like region 86, as shown. The ridges 92 about the second disc-like region 86 provide increased surface area and irregular topography for adhering to the epoxy 60.

As illustrated in FIG. 3, the first disc-like region 84 extends coaxially from the bottom surface of the second disc-like region 86.

It should be understood, that although the uper heat sink 82 has been discussed in terms of "disk-like" regions having "diameters", that the upper heat sink is preferably square in plan profile, corresponding to the square configuration of the die 52 and the square configuration of the semiconductor device assembly (See, e.g., FIG. 1A).

A notable feature of the heat sink 82 is that it is provided with "feet" or "pedestals" 88, which may be formed integrally with the heat sink. Typically, there would be four of such pedestals, and they would rest atop the intermediate KAPTON ring portion 44B. Returning momentarily to FIGS. 1A and 1C, a convenient resting place for the pedestals 88 is to be found in the square corner sections 30 of the intermediate ring portion 14B.

The heat sink 82 is further provided with an add-on section 96, which is external to the semiconductor chip assembly. The add-on portion 96, as illustrated, includes two parallel, spaced-apart disc-like portions 98 and terminates in a flat upper surface 102. The bottom of the add-on section 96 is provided with a "button" 100 which fits into a recess 90 in the upper surface of the heat sink 82.

As illustrated in FIG. 3, the disc-like portions 98 of the add-on section 96 are coaxial, parallel and spaced apart. However, it is clearly envisioned that the add-on portion 96 can be formed with a different configuration, depending upon the cooling requirements and characteristics of the environment in which the semiconductor device assembly 80 is intended to operate. For instance, more than two disk-like portions 98 can be provided to provide more parallel "fins" for the heat sink. Furthermore, the configuration and/or orientation of such fins can be mocified to take advantage of a directional cooling air flow. Conceivably, the add-on section 96 could be configured with cooling ducts for receiving a cooling liquid.

As illustrated in FIG. 3, the add-on section 96 is fitted to the embedded section 82 of the upper heat sink by means of a button 100 on the add-on section 96 and a corresponding recess 90 on the embedded portion 82. This would be readily accomplished with an adhesive, preferably a thermally-conductive adhesive. Alternatively, the button 100 and recess 90 could be threaded, so that the add-on section 96 would screw into the embedded portion 82 of the upper heat sink.

Heat Sink Characteristics

The first (lower) heat sink, formed by the shim 64, provides an effective heat sink when the semiconductor device assembly 40 or 80 is mounted to a printed circuit board, inasmuch as the printed circuit board provides a thermal mass for carrying away heat generated by the semiconductor device 52. When mounting the semiconductor device assembly to a printed circuit board (or other suitable thermal mass) it is preferably to employ thermal grease to ensure effective heat transfer between the shim 64 and the printed circuit board.

The second (upper) heat sink 70 (FIG. 2), or 82 (FIG. 3, including the add-on section 96), provides an effective heat sink when the semiconductor device assembly 40 or 80 is mounted in a manner that air (convection) cooling is available.

Each of the upper and lower heat sinks can be expected to provide up to a 30% increase in cooling (heat dissipation) for the semiconductor device, and in aggregate they can be expected to provide a 50% increase in cooling.

As noted hereinbefore, the upper heat sink of either embodiment is of further benefit in that it provides a flat registration surface for automated handling of the semiconductor device assembly.

Additionally, the upper heat sink of FIG. 3 is of further benefit in that only a portion 82 thereof is "permanently" assembled with the semiconductor device assembly, which can be in advance of any sale thereof, and an "add-on" portion 96 is readily added thereto, the ultimate configuration of the upper heat sink being flexible and readily implemented depending upon the specific application requirements of the end user.

Figure 4A:
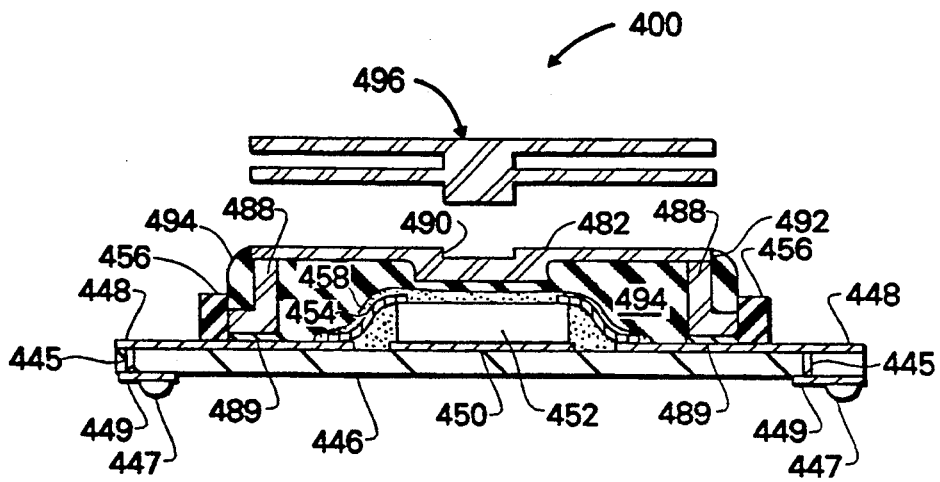
FIG. 4A is a cross-sectional view of another alternate embodiment of the heat sink for semiconductor device assembly of the present invention.

FIG. 4A shows an alternate embodiment 400 of the present invention employing a heat sink similar to that shown in FIG. 3. According to FIG. 4A, a die 452 is mounted to a printed circuit board support structure 446 having upper conductive traces 448 and a die mounting pad 450 (preferably a printed region on the board formed of the same material and in the same manner as the conductive traces) on the top (component side), and lower conductive traces 449 on the bottom (connection side). Bond wires 454 connect die 452 to upper conductive traces 448. A silicon gel material 458 is disposed around leads 454 and over die 452. A heat sink "fixed" 482 having "legs" 488 (similar to the heat sink fixed portion 82 with respect to FIG. 3) sits atop insulators 489. Heat sink "fixed" portion 482 is adapted with a receptacle 490 to receive an add-on portion 496. A rubber-like or plastic like ring 456, preferably made of RYTON, is attached to the printed circuit board support structure with an adhesive. Ultimately, the die 452, bond wires 454, and silicon gel 458 are encased in a suitable epoxy potting compound 494 and "fixed" heat sink portion 482 is disposed such that its lower surface is in complete contatct with the potting compound 494. Heat sink "fixed" portion 482 is analogous to and handled in the same manner as the heat sink "fixed" portion 20 discussed with respect to FIG. 3.

Upper conductive traces 448 are electrically connected to lower conductive traces 449 by electrically conductive vias 445, passing through the printed circuit board support structure 446, thus completing electrical connections between the die 452 and the lower conductive traces 449 through the vias 445, upper conductive traces 448, and bond wires 454. Solder bump electrical terminations are disposed onto lower conductive traces 449, forming contact points by which the entire assembly may be surface-mounted to a circuit board using reflow soldering techniques. Reflow soldering is well known to those skilled in the art. Techniques for depositing solder bump electrical connections are known to those skilled in the art, and examples of such techniques are given in U.S. Pat. No. 4,700,276 entitled "ULTRA HIGH DENSITY PAD ARRAY CHIP CARRIER", issued on Oct. 13, 1987 to Freyman et al., and in U.S. Pat. No. 4,700,473 entitled "METHOD OF MAKING AN ULTRA HIGH DENSITY PAD ARRAY CHIP CARRIER", issued on Oct. 20, 1987 to Freyman et al.

Printed circuit board support structure 446 is preferably formed of a fiberglass-like printed circuit board material, (e.g., FR4 or BT resin), but other materials, such as ceramics, are also suitable.

In the event that "legs" 488 and conductive traces 448 are adapted such that legs 488 do not rest on or touch conductive traces 448, or if a non-conductive (electrically) material is used for the legs 488, then insulators 489 are not necessary. Further, if a printed circuit board material is chosen such that a suitable bond may be achieved directly between the die 452 and the printed circuit board support structure 446, then no die mounting pad 450 is required.

Figure 4B:
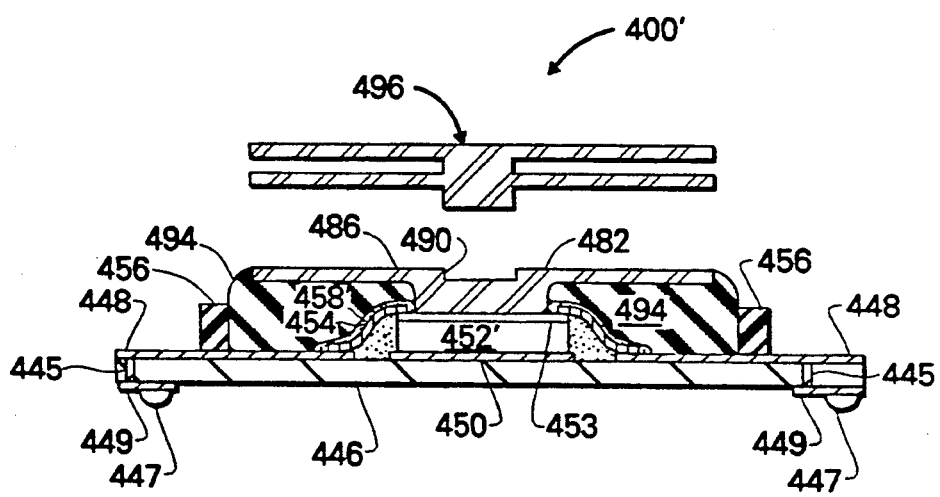
FIG. 4B is a cross-sectional view of another alternate embodiment of the heat sink for semiconductor device assembly of the present invention.

FIG. 4B shows another alternate embodiment 400' of the present invention, similar to that shown in FIG. 4A. In this Figure, however, a die 452' has a passivation layer 453 as its uppermost layer, providing electrical insulation. As a result of this passivation layer 453, it is not mecessary to space heat sink "fixed" portion 482 away from die 452'. Heat sink "fixed" portion 482 rests directly on top of die 452' (preferably with some sort of conformal heat conductive material provided to fill any gaps in-between). The ability to place the heat sink 482 in direct contact with the die 452' permits even better heat transfer away from the die and eliminates the need for feet (although they may be used, if better alignment of the assembly will be achieved).

It should be noted that the technique of FIG. 4B, wherein a die having a passivation layer is used, permitting direct contact between the heat sink and the die, may be applied to the type of upper heat sink shown in FIG. 2. The technique of providing solder bump electrical terminations may also be applied to any of the other embodiments.

What is claimed is:

1. A semiconductor device assembly comprising:
   a die attach pad having a periphery;
   a die having a top surface containing circuit elements and a bottom surface, mounted by its bottom surface atop the die attach pad;
   a plurality of leads having inner ends and extending generally radially outwardly from adjacent the die attach pad;
   a first, segmented plastic film layer disposed atop the leads, a portion of the first plastic film layer bridging a gap between the inner ends of the leads and the die attach pad and leaving a portion of the leads exposed;
   a plurality of bond wires connecting the circuit elements of the top surface of the die to the exposed portions of the inner ends of the leads;
   a second plastic film layer disposed beneath the leads, and beneath the periphery of the die attach pad;
   a ring-like frame disposed atop the leads;
   epoxy disposed atop the leads, covering the circuit elements, completely encapsulating the die and extending to the ring-like frame, thereby forming an encapsulated semiconductor device assembly;
   a first heat sink structure disposed atop the die, facing the circuit element containing top surface of the die, having a first portion in contact with a passivation layer over the circuit element containing top surface of the die, within the epoxy, and having a second portion extending from within the epoxy at least to an exterior surface of the epoxy, thereby forming a self-contained integral heat sink structure within the semiconductor device.

2. Apparatus according to claim 1, wherein:
   the second portion of the first heat sink structure includes ridges for adhering to the epoxy.

3. Apparatus according to claim 1, wherein:
   the second portion of the first heat sink structure forms a flat registration surface for the semiconductor device assembly.

4. Apparatus according to claim 3, further comprising:
   a second, heat sink structure forming an "add-on section" non-integral with the semiconductor device assembly; and
   means for joining the second heat sink structure to the flat registration surface of the first heat sink structure.

5. Apparatus according to claim 4, wherein:
   the means for joining is a button in the second heat sink structure and a corresponding recess in the flat registration surface of the first heat sink structure.

6. Apparatus according to claim 5, wherein:
   the button and the recess are threaded for joining the second heat sink structure to the first heat sink structure.

7. Apparatus according to claim 1, wherein:
   the first portion of the first heat sink structure includes pedestals resting on the first plastic film layer, and encapsulated by the epoxy.

8. Apparatus according to claim 1, wherein:

the first portion of the first heat sink structure has a first disk-like region having a first diameter and a surface in contact with a passivation layer over the circuit element containing containing surface of the die;

the second portion of the first heat sink structure is a second disk-like region of having a second diameter greater than the first diameter and terminating in an upper flat surface exterior the epoxy; and a third portion of the first heat sink structure is a third disk-like region disposed between the first and second disk-like regions having a third diameter larger than the first diameter and smaller than the second diameter, and provided with ridges for adhering to the epoxy.

9. Apparatus according to claim 1, wherein:
the first heat sink structure is formed of metal.

10. Apparatus according to claim 1, wherein:
the first heat sink structure is formed of ceramic.

11. Apparatus according to claim 1, wherein:
the second plastic film layer extends only to just within the periphery of the die attach pad, and is disposed underneath the die attach pad leaving a "cutout" opening in the second plastic film layer directly beneath the die attach pad; and further comprising:
a second heat sink structure in the form of a thermally-conductive shim larger than the die and centered immediately below and closely adjacent the die on a side of the second plastic film layer opposite the die; and means for attaching the shim to the bottom of the die through the cutout opening int he second plastic film layer.

12. Apparatus according to claim 11, wherein:
the shim is formed of aluminum.

13. Apparatus according to claim 11, wherein:
the shim is formed of ceramic material.

14. Apparatus according to claim 11, wherein:
the means for attaching is epoxy.

15. Apparatus according to claim 11, wherein:
the thermal expansion characteristics of the shim are closely matched to the thermal expansion characteristics of the second plastic film layer.

16. A semiconductor device assembly comprising:
a printed circuit board support structure having a top surface and a bottom surface;

a die attach pad on the top surface of the printed circuit board support structure, said die attach pad having a periphery;

a die having a top surface containing circuit elements and a bottom surface, mounted by its bottom surface atop the die attach pad;

a plurality of upper conductive traces on the top surface of the printed circuit board having inner ends and extending generally radially outwardly from adjacent the die attach pad;

a plurality of bond wires connecting the circuit elements of the top surface of the die to the exposed portions of the inner ends of the upper conductive traces;

a ring-like frame disposed atop the leads;

epoxy disposed atop the leads, covering the circuit elements, completely encapsulating the die and extending to the ring-like frame, thereby forming an encapsulated semiconductor device assembly;

a first heat sink structure disposed atop the die, facing the circuit element containing top surface of the die, having a first portion in close proximity to the circuit element containing top surface of the die, within the epoxy, and having a second portion extending from within the epoxy at least to an exterior surface of the epoxy, thereby forming a self-contained integral heat sink structure within the semiconductor device;

a plurality of lower conductive traces on the bottom surface of the printed circuit board support structure;

a plurality of electrically conductive vias disposed through the printed circuit board support structure, said electrically conductive vias connecting selected ones of the upper conductive traces and lower conductive trace and electrically conductive therebetween; and a plurality of solder bump electrical terminations disposed on the lower conductive traces.

17. Apparatus according to claim 16, wherein:
the second portion of the first heat sink structure includes ridges for adhering to the epoxy.

18. Apparatus according to claim 6, wherein:
the second portion of the first heat sink structure forms a flat registration surface for the semiconductor device assembly.

19. Apparatus according to claim 18, further comprising:
a second, heat sink structure forming an "add-on section" non-integral with the semiconductor device assembly; and means for joining the second heat sink structure to the flat registration surface of the first heat sink structure.

20. Apparatus according to claim 19, wherein:
the means for joining is a button in the second heat sink structure and a corresponding recess in the flat registration surface of the first heat sink structure.

21. Apparatus according to claim 20, wherein:
the button and the recess are threaded for joining the second heat sink structure to the first heat sink structure.

22. Apparatus according to claim 16, wherein:
the first portion of the first heat sink structure includes pedestals resting on the printed circuit board support structure, and encapsulated by the epoxy.

23. Apparatus according to claim 16, wherein:
the first portion of the first heat sink structure has a first disk-like region having a first diameter and a surface in close proximity to the circuit element containing surface of the die;

the second portion of the first heat sink structure is a second disk-like region of having a second diameter greater than the first diameter and terminating in an upper flat surface exterior the epoxy; and a third portion of the first heat sink structure is a third disk-like region disposed between the first and second disk-like regions having a third diameter larger than the first diameter and smaller than the second diameter, and provided with ridges for adhering to the epoxy.

24. Apparatus according to claim 16, wherein:
the first heat sink structure is formed of metal.

25. Apparatus according to claim 16, wherein:
the first heat sink structure is formed of ceramic.

26. Apparatus according to claim 16, further comprising:
a passivation layer over the circuit element containing surface of the die;

wherein:
the first portion of the first heat sink structure is in contact with the passivation layer.

* * * * *